United States Patent [19]
Shou et al.

[11] Patent Number: 5,568,080
[45] Date of Patent: Oct. 22, 1996

[54] COMPUTATIONAL CIRCUIT

[75] Inventors: Guoliang Shou; Sunao Takatori; Makoto Yamamoto, all of Tokyo, Japan

[73] Assignees: Yozan Inc, Tokyo; Sharp Corporation, Osaka, both of Japan

[21] Appl. No.: 467,827

[22] Filed: Jun. 6, 1995

Related U.S. Application Data

[60] Division of Ser. No. 262,059, Jun. 17, 1994, and a continuation-in-part of Ser. No. 242,837, Mar. 16, 1994, Pat. No. 5,440,605.

[30] Foreign Application Priority Data

| | | | |
|---|---|---|---|
| Jun. 17, 1993 | [JP] | Japan | 5-171041 |
| Jun. 18, 1993 | [JP] | Japan | 5-172551 |
| Jun. 18, 1993 | [JP] | Japan | 5-172552 |
| Jun. 22, 1993 | [JP] | Japan | 5-174713 |
| Jun. 24, 1993 | [JP] | Japan | 5-177362 |
| Jun. 30, 1993 | [JP] | Japan | 5-187215 |
| Sep. 20, 1993 | [JP] | Japan | 5-256355 |
| Sep. 20, 1993 | [JP] | Japan | 5-256359 |
| Sep. 20, 1993 | [JP] | Japan | 5-256367 |
| Sep. 20, 1993 | [JP] | Japan | 5-256518 |
| Sep. 20, 1993 | [JP] | Japan | 5-256557 |
| Sep. 20, 1993 | [JP] | Japan | 5-256558 |
| Apr. 1, 1994 | [JP] | Japan | 5-087720 |

[51] Int. Cl.⁶ .............................. G06F 7/44; G06G 7/16
[52] U.S. Cl. .................................. 327/356; 327/358
[58] Field of Search ........................ 327/355, 356, 327/358, 361, 363, 91, 94, 96, 551, 552, 558

[56] References Cited

U.S. PATENT DOCUMENTS

| | | | |
|---|---|---|---|
| 4,218,665 | 8/1980 | Fujisaki | 333/165 |
| 5,305,250 | 4/1994 | Salam et al. | 327/356 |
| 5,311,087 | 5/1994 | Suganuma | 307/520 |
| 5,408,142 | 4/1995 | Takatori et al. | 327/91 |
| 5,416,370 | 5/1995 | Takatori et al. | 327/356 |
| 5,416,439 | 5/1995 | Shou et al. | 327/356 |
| 5,440,605 | 8/1995 | Shou et al. | 327/94 |
| 5,444,411 | 8/1995 | Yang et al. | 327/361 |
| 5,457,417 | 10/1995 | Shou et al. | 327/356 |

OTHER PUBLICATIONS

Massara, Robert E., "Synthesis of Low-Pass Forms," The Electrical Engineering Handbook, 1993, pp. 674–691.

*Primary Examiner*—Timothy P. Callahan
*Assistant Examiner*—T. Lam
*Attorney, Agent, or Firm*—Cushman, Darby & Cushman

[57] ABSTRACT

A computational circuit that includes a selector for providing an input to one of a plurality of sample/hold circuits. The outputs of the sample/hold circuits are provided to a multiplexer. The output of the multiplexer is provided to a computational portion, such as a multiplier.

2 Claims, 4 Drawing Sheets

COMPUTATIONAL CIRCUIT

CROSS REFERENCES TO RELATED APPLICATIONS

This application is a divisional of U.S. patent application Ser. No. 08/262,059, filed Jun. 17,1994 and continuation-in-part of U.S. patent application Ser. No. 08/242,837 filed Mar. 16, 1994, which issued as U.S. Pat. No. 5,440,605.

BACKGROUND OF THE INVENTION

1. Field of the Invention

The present invention relates to computational circuits for calculating addition, multiplication, comparison, quantizing and exponentials of substantially analog values.

2. Description of the Related Art

In the conventional digital computers, computations are performed using many combinations of simple digital logic circuits. Digital computation is accurate and redundant. However, it is limited due to the large equipment costs required for high precision manufacturing of the digital logic circuits. Analog computation was frequently used mainly for solving differential equations, but because of the limitations of digital electronics noted above, analog computation is attracting attention again. Operational amplifiers are used in conventional analog computation. However, a lot of electric power is necessary for large scale analog computation because it is driven by current. As a result, it is difficult to provide a practical circuit for solving a large scale complicated calculation.

SUMMARY OF THE INVENTION

Therefore, it is an object of the present invention to provide an analog computational circuit for performing a large scale and complicated computation.

According to the present invention, various combination circuits are proposed in which addition is performed by a capacitive coupling and multiplication is performed by weighting the capacitive coupling.

Multiplication is also performed by means of a logarithmic calculation circuit for transforming a voltage into a time length, which is also useful for exponential calculation.

DETAILED DESCRIPTION OF THE PRESENTLY PREFERRED EMBODIMENTS OF THE INVENTION

Hereinafter, a first embodiment of a computational circuit for multiplication according to the present invention is described.

Figure 1:
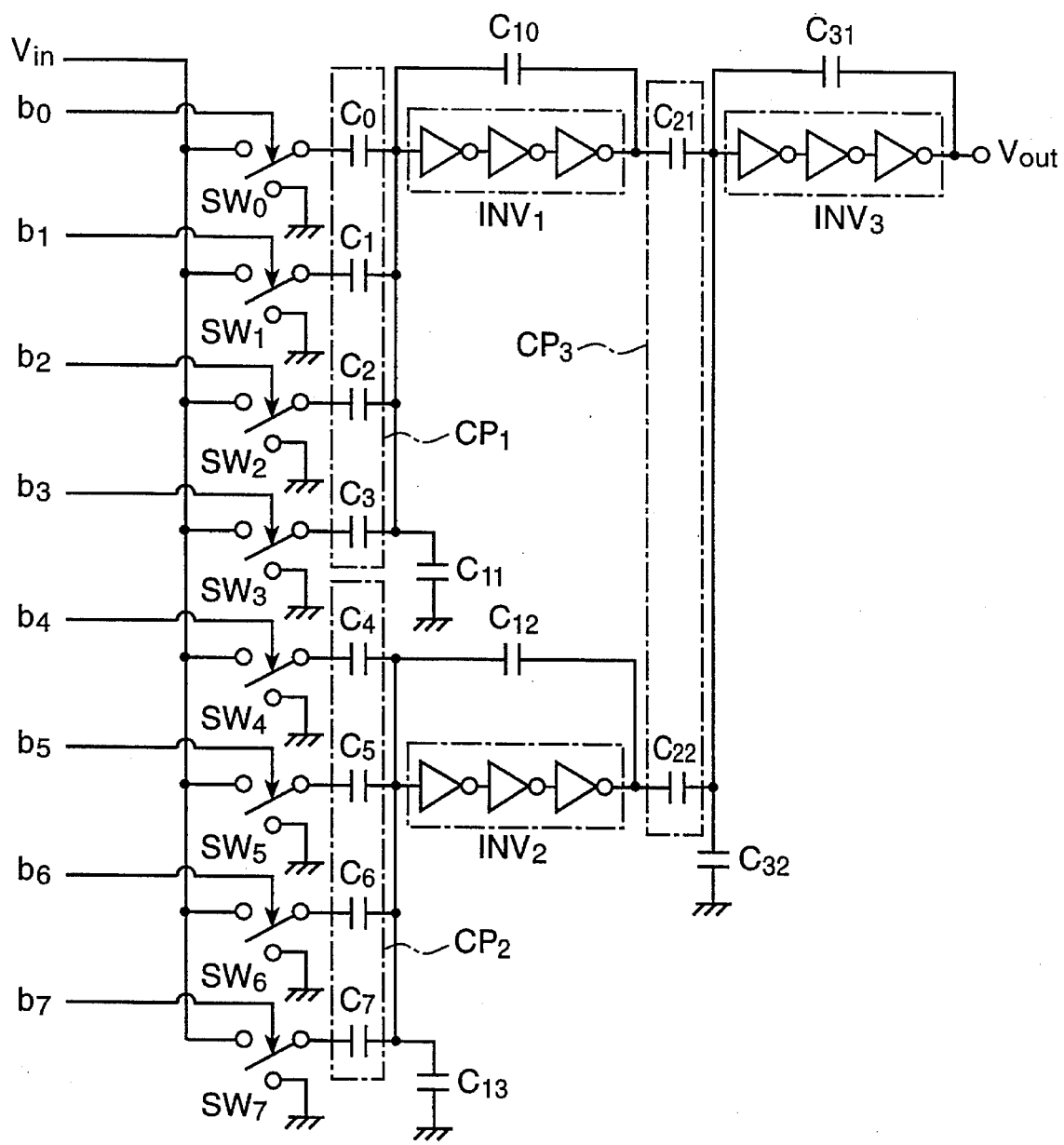
FIG. 1 shows a first embodiment of a multiplication circuit.

FIG. 1 illustrates a computation circuit for multiplication that includes switches that are controlled by digital data. The multiplication circuit in FIG. 1 consists of a plurality of switching means SW1 to SW7 commonly receiving an analog input voltage Vin. Switches SW1 to SW7 are controlled by a digital signal having bits from b0 to b7. The switching means are classified into two groups, the first group from SW0 to SW3 and the second group from SW4 to SW7. The first group is connected to a capacitive coupling CP1 and the second is connected to a capacitive coupling CP2. CP1 consists of capacitors C0 to C3 having capacitances corresponding to the weights of b0 to b3. CP2 consists of capacitors C4 to C7 having capacitances corresponding to the weights of b4 to b7. CP1 and CP2 are grounded through capacitances C11 and C13, respectively. Outputs from CP1 and CP2 are input to inverters INV1 and INV2, respectively. Outputs of the inverters are added with weights by a capacitive coupling CP3. CP3 is grounded through a capacitance C32 and outputs an analog output voltage Vout. Each of INV1 to INV3 consists of a three stage inverter having three individual inverters serially connected so that the output of each inverter has a high degree of accuracy, because the gain of the three inverters is high. INV1 to INV3 each have a feed back line from their output to their input through capacitances C10, C12 and C31, respectively. The relationship among capacitances are as follows.

$$C10 - C11 = C0 + C1 + C2 + C3 \quad (1)$$

$$C12 - C13 = C4 + C5 + C6 + C7 \quad (2)$$

$$C31 + C32 = C21 + C22 \quad (3)$$

and, $$\sum_{i=0}^{3} Ci(Vi - V11) + C10(V11 - V21) + C11V11 = 0 \quad (4)$$

$$\sum_{i=4}^{7} Ci(Vi - V12) + C12(V12 - V22) + C13V12 = 0 \quad (5)$$

$$C21V21 + C22V22 + C31(V31 - Vout) + C32V31 = 0 \quad (6)$$

$$V21 = GV11, \ V22 = GV12, \ Vout = GV31 \quad (7)$$

where,

G is the open gain of INV1, INV2 and INV3,

Vi is the input voltage of C0 to C7 (i=0~7),

V11 is the input voltage of INV1,

V12 is the input voltage of INV2, and

V31 is the input voltage of INV3 then, the following formula is approximately obtained.

$$V21 = \sum_{i=0}^{3} CiVi/C10 \quad (8)$$

$$V22 = \sum_{i=4}^{7} CiVi/C12 \quad (9)$$

$$Vout = (C21V21 + C22V22)/C31 \quad (10)$$

Here, each switch SWi is connected to Vin or ground based on bit bi so that Vi is equal to Vin or "0". Each capacitance is therefore defined by one or a plurality of the unit capacitances Cu, as follows.

$$Ci = 2^i \times Cu \quad (i=0\text{-}3) \quad (11)$$

$$Ci = 2^{i-4} \quad (i=4\text{-}7) \quad (12)$$

$$C11 = C13 = C32 = Cu \quad (13)$$

$$C22 = 2^4 \times C21 \quad (14)$$

$$C31 = 2^4 \times Cu \quad (15)$$

Therefore, the final computation result is a multiplication of analog and digital data.

$$Vout = \sum_{i=0}^{7} 2ibiVin/2^8 \quad (16)$$

and, $$Vout = \sum_{i=0}^{7} 2ibiVin/2^7 \quad (17)$$

when, $$C31 = 2^3 \times Cu \quad (18)$$

The output level according to formula (17) is twice the level of formula (16). Various output voltage levels can be obtained by such weight adjustment.

As will be understood by formula (12), the capacitance range of C0 to C7 is in the order of 23 because of the classification of data into an upper bit group and a lower bit group, as well as the integration of both groups. This is advantageous in manufacturing of LSI circuits because a large capacitance needs a lot of area on the silicon wafer.

In the first embodiment of the multiplication circuit, analog and digital data are directly multiplied without A/D or D/A converter.

Figure 2:
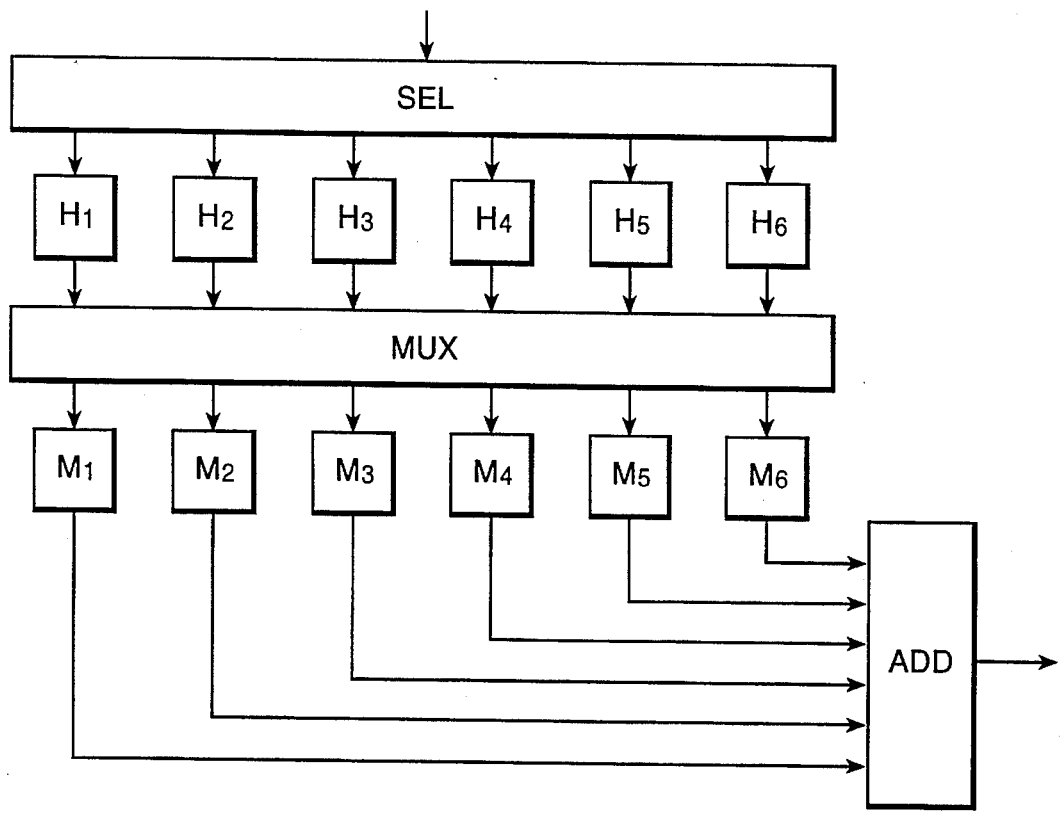
FIG. 2 shows a block diagram of a second embodiment of multiplication circuit used in an analog computational circuit.
Figure 3:
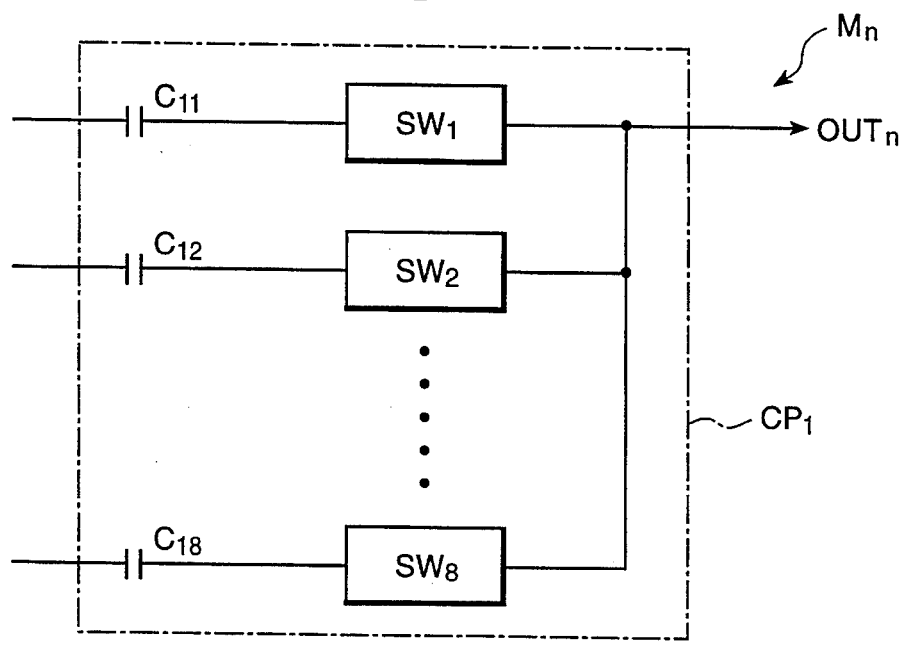
FIG. 3 shows a circuit diagram of a multiplication portion of the circuit shown in FIG. 2.
Figure 4:
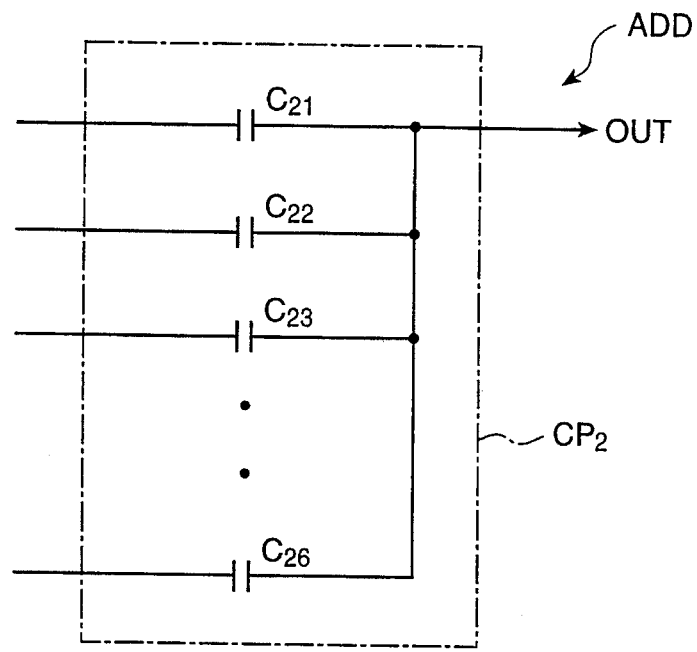
FIG. 4 shows a circuit diagram of an addition portion of the circuit shown in FIG. 2.

FIGS. 2 to 4 show a second embodiment of the multiplication circuit.

In FIG. 2, a multiplication circuit includes a selector SEL having one input and a plurality of outputs, each output of which is connected to a sample/hold circuit H1 to H6. The sample/hold circuits are connected to a multiplexer MUX, which selectively connects any one of the sample/hold circuits to any one of a plurality of multipliers M1 to M6. The outputs of the multipliers are provided to an adder ADD to be summed.

When an analog input X is input to the selector SEL, the selectors input the analog data X to one of the sample/hold circuit according to a predetermined sequence. The multiplication circuit can be used as a finite input response filter for multiplying a plurality of successive data by predetermined multipliers and for adding the multiplied data. Since one multiplication is performed by a predetermined one multiplier, one unit of data is successively transmitted to one of the sample/hold circuits. By changing data flow by means of the selector and the multiplexer, it is unnecessary to transmit data from one multiplier, thereby preventing transmission error.

An example of a multiplication circuit Mn is shown in FIG. 3. The circuit consists of a plurality of switching means SW1 to SWn to which capacitors C11 to C1n are connected, respectively. Capacitors C11 to C1n have capacitances corresponding to weights of digital bits of multipliers. Similar to the embodiment in FIG. 1, SW1 to SWn are controlled by digital data so that SWi, corresponding to high level bit, are closed. Then, the analog data is directly multiplied by a digital data. An output OUTn of the multiplier Mn is input to the multiplexer MUX.

The addition circuit ADD is shown in detail in FIG. 4. The addition circuit consists of a capacitive coupling CP2 having a plurality of capacitors C21 to C26. The capacitors have equal capacitances so that OUT1 to OUT6 are added with equal weights to provide the final output OUT.

Figure 5:
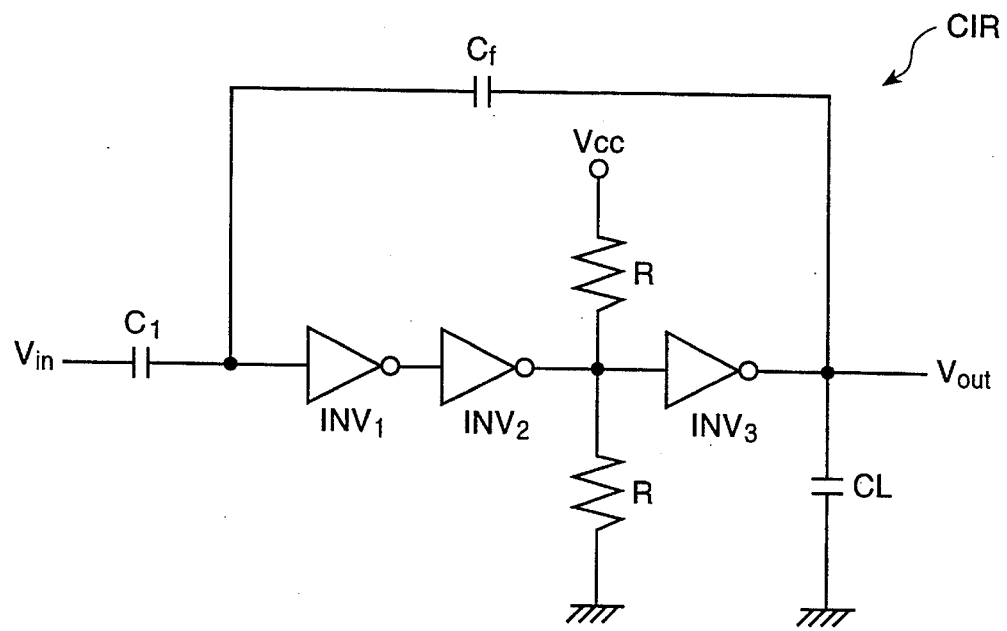
FIG. 5 is a circuit diagram showing an embodiment of an inverter circuit.

Next, an improvement of an inverter effective for use in the above described addition and multiplication circuits will be described. In FIG. 5, an embodiment of an inverter circuit CIR is shown. The inverter CIR includes three inverters INV1, INV2 and INV3. The output of inverter INV3 is fed through a feed back capacitance Cf back to the input of inverter INV1. Inverter circuit CIR has a high open gain so as to provide high accuracy in the output voltage. An input voltage Vin is input to the CIR through a capacitance C1 so that current in the CIR is minimized.

Figure 7:
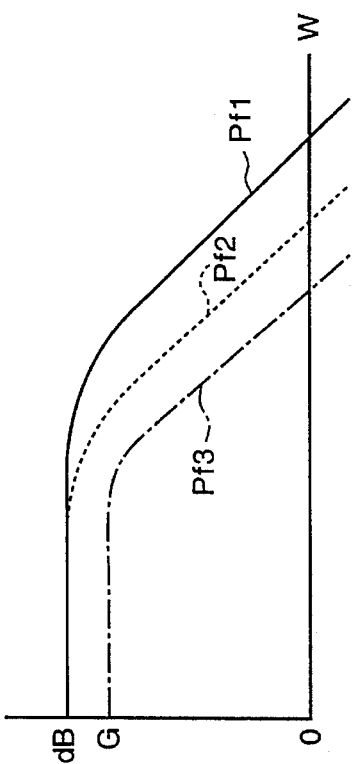
FIG. 7 shows the gain characteristics of the circuit in FIG. 5.

Because the inverter in an LSI circuit is very small, the delay time of its output is small and the resonance frequency is low. The output terminal of the CIR is connected through a capacitance CL to ground, as a low pass filter. FIG. 7 is a frequency performance graph of the CIR in which a solid line Pf1 is the performance without CL and a broken line Pf2 is that the CL. It can be appreciated that the gain is lowered in high frequency.

An equilibrium resistance with a pair of resistances R and R is connected to CIR between the second and the third inverters. One resistance R is connected at one terminal to a voltage source Vcc and at the other terminal to the output of the second inverter INV2. The other resistance R is connected at one terminal to the output of INV2 and at the other terminal to the ground. The grounded resistance R decreases the open gain of INV2 so as to decrease the total gain of the CIR. In FIG. 7, the one dot broken line Pf3 shows both effects of the low pass filter and the equilibrium resistance. Phase redundancy and gain redundancy are obtained, so resonance is prevented even at high frequencies. The resistance R connected to Vcc improves the current balance of pMOS and nMOS in inverter INV2 so as to lighten the load of these MOSs.

When only the low pass filter is provided, CL becomes rather big, and when only the equilibrium resistance is provided, lineality becomes poor.

The equilibrium resistance can be connected to the output of the first inverter INV1.

Figure 6:
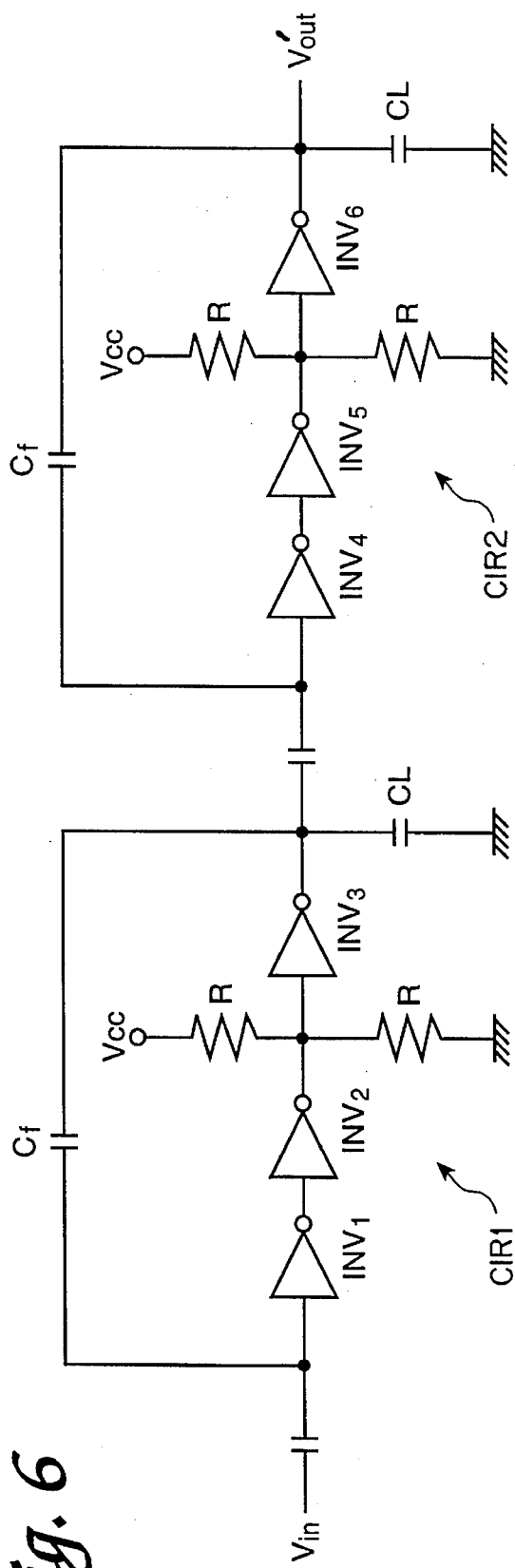
FIG. 6 shows a combination circuit of the embodiment shown in FIG. 5.

The inverter circuit in FIG. 5 has inverting function. In order to obtain non-inverting function, two of inverter circuit CIR are sequentially connected as shown in FIG. 6.

What is claimed is:

1. A computational circuit comprising:

a selector having one input terminal and a plurality of output terminals for selectively connecting an input at said input terminal to one of said output terminals;

a plurality of sample/hold circuits each of which is connected to respective output terminals of said selector for holding data output from said selector;

a multiplexer, connecting to said plurality of sample/hold circuits, having a plurality of input terminals and at least one output terminal for selectively connecting one of said input terminals thereof to said output terminal thereof; and a computational unit connected to said at least one output terminal of said multiplexer.

2. A computational circuit as claimed in claim 1, further comprising;

an inverter circuit having a plurality of individual inverters connected in sequence to an output of said computational unit;

a feed back capacitance connecting an output of a last inverter in said sequence to an input of a first inverter in said sequence;

a low pass capacitance connecting said output of said last inverter to ground; and an equilibrium resistance connected to an output of one of said inverters in said sequence other than said first inverter and said last inverter.

* * * * *